(12) United States Patent
Chaiken et al.

(10) Patent No.: US 11,467,936 B2
(45) Date of Patent: Oct. 11, 2022

(54) PREDICTING MOTHERBOARD CONNECTOR FAILURES

(71) Applicant: Dell Products L.P., Round Rock, TX (US)

(72) Inventors: Craig Lawrence Chaiken, Pflugerville, TX (US); Siva Subramaniam Rajan, Austin, TX (US); John Robert Lerma, Cedar Park, TX (US); Adolfo S. Montero, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 17/164,138

(22) Filed: Feb. 1, 2021

(65) Prior Publication Data

US 2022/0245042 A1  Aug. 4, 2022

(51) Int. Cl.
| | |
|---|---|
| *G06F 11/00* | (2006.01) |
| *G06F 11/30* | (2006.01) |
| *G06F 11/07* | (2006.01) |
| *G06K 9/62* | (2022.01) |

(52) U.S. Cl.
CPC ........ *G06F 11/3031* (2013.01); *G06F 11/076* (2013.01); *G06F 11/0757* (2013.01); *G06F 11/0772* (2013.01); *G06K 9/6256* (2013.01)

(58) Field of Classification Search
CPC .................................................. G06F 11/3031
See application file for complete search history.

(56) References Cited

U.S. PATENT DOCUMENTS

| | | | | |
|---|---|---|---|---|
| 7,321,313 B1 * | 1/2008 | Inlow | ................... | H01R 13/641 340/687 |
| 10,431,032 B2 * | 10/2019 | Falk | ....................... | G07C 11/00 |

\* cited by examiner

*Primary Examiner* — Amine Riad
(74) *Attorney, Agent, or Firm* — Kirton McConkie; Brian Tucker

(57) ABSTRACT

Motherboard connector failures can be predicted. An embedded controller can be employed on the motherboard to monitor when devices are connected to and disconnected from the motherboard's connectors. The embedded controller can maintain an event log and connector information in which it counts the number of times a device is connected to/disconnected from a connector. The BIOS can leverage the event log and the connector information to notify an end user to take action to correct or prevent possible corrosion. Training records may also be employed to predict connector failure. The training records can track and maintain baseline and periodic device training attributes. When the periodic training attributes deviate from the baseline training attributes, an end user can be notified to take action to remove corrosion.

15 Claims, 13 Drawing Sheets

PREDICTING MOTHERBOARD CONNECTOR FAILURES

CROSS-REFERENCE TO RELATED APPLICATIONS

N/A

BACKGROUND

The motherboard of a computer typically includes a number of connectors (or slots) that allow the end user to selectively connect devices. For example, a motherboard for a laptop may have a M.2 connector for connecting a solid state drive (SSD) module, one or more small outline dual in-line memory module (SODIMM) connectors for connecting one or more SODIMMs, a M.2 connector for connecting a WLAN module, etc. To prevent corrosion, such connectors (or more particularly, the contacts of such connectors) may be plated with gold or another conductive, corrosion-resistant metal.

In some cases, end users may repeatedly connect and disconnect devices to the respective connectors on the motherboard. For example, some end users may be required to connect an SSD module at the beginning of the workday and then disconnect it at the end of the workday. These repeated connection cycles may cause the connector's plating to wear away over time thereby exposing the underlying metal. The resulting oxidation of the underlying metal can cause the connector to fail. For connectors with very thin plating, oxidation may commence after a few connection cycles.

To address this issue, some manufacturers may use thicker plating to increase the number of connection cycles that may be performed before the plating is worn away. However, considering the cost of gold, thicker plating may be cost prohibitive for many end users. Additionally, although periodic cleaning may prolong the life of a connector having worn plating, it may ultimately be necessary to replace the motherboard.

BRIEF SUMMARY

The present invention extends to methods, systems and computer program products for predicting motherboard connector failures. An embedded controller can be employed on the motherboard of a computer to monitor when devices are connected to and disconnected from the motherboard's connectors. The embedded controller can maintain an event log identifying when a device is connected to/disconnected from each monitored connector. The embedded controller can also maintain connector information in which it counts the number of times a device is connected to/disconnected from a connector including when the system is not in an active state. The system BIOS can leverage the event log and the connector information to notify an end user to take corrective or preventive action.

In some embodiments, the embedded controller may additionally or alternately maintain training records for the monitored connectors. The embedded controller can employ a training record to initially calculate a connector's baseline training time and baseline training voltage. After the computer has been used for a period of time, the embedded controller can subsequently calculate the connector's training time and training voltage to determine to what extent they deviate from the baseline training time and baseline training voltage. If the current training time or training voltage deviates from the baseline training time or baseline training voltage in excess of a defined threshold, the system BIOS can notify an end user to take corrective or preventive action.

In some embodiments, the present invention is implemented by a component of a motherboard as a method for predicting motherboard connector failures. The component, such as an embedded controller, can detect when a device is connected to or disconnected from a monitored connector. Each time the component detects that a device is connected to or disconnected from the monitored connector, it can increment a count. The component can compare the count to a maximum count for the monitored connector. When the count exceeds the maximum count, the component can notify an end user.

In some embodiments, the present invention is implemented by a component of a motherboard as a method for predicting motherboard connector failures. During each of an initial set of boots, the component can calculate and store a training time and a training voltage for a monitored connector. The component can then calculate a baseline training time from the training times stored during the initial set of boots and a baseline training voltage from the training voltages stored during the initial set of boots. During each of a subsequent set of boots; the component can calculate and store a training time and a training voltage for the monitored connector. The component can then calculate a periodic training time from the training times stored during the subsequent set of boots and a periodic training voltage from the training voltages stored during the subsequent set of boots. The component can compare the periodic training time to the baseline training time and the periodic training voltage to the baseline training voltage. When either the periodic training time exceeds the baseline training time by a defined threshold or the periodic training voltage exceeds the baseline training voltage by a defined threshold, an end user can be notified.

In some embodiments, the present invention can be implemented as a motherboard having an embedded controller and one or more monitored connectors. The embedded controller can be configured to perform a method for predicting a failure of the one or more monitored connectors. The embedded controller can maintain a count and a maximum count for each of one or more monitored connectors. The embedded controller can detect when a device is connected to or disconnected from any of the one or more monitored connectors. Each time the embedded controller detects that a device is connected to or disconnected from a particular monitored connector of the one or more monitored connectors, it can increment the count for the particular monitored connector. In response to determining that the count for a particular monitored connector of the one or more monitored connectors exceeds the maximum count for the particular monitored connector, an end user can be notified.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the present invention will be described primarily in the context of a laptop. However, the present invention could equally be implemented in the context of a desktop, tablet or any other computer that includes a motherboard with connectors that are susceptible to corrosion.

Figure 1:
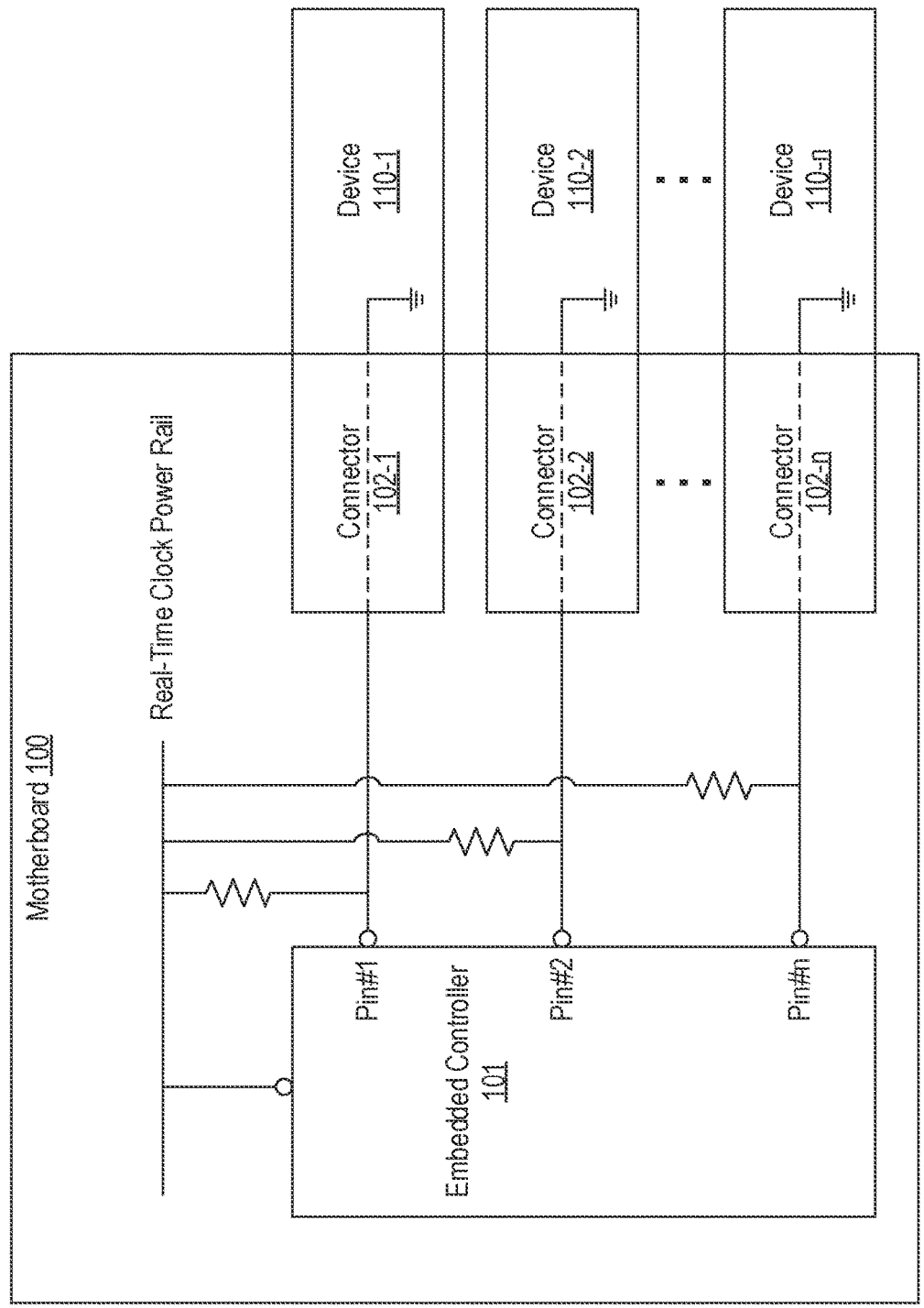
FIG. 1 is a block diagram of a motherboard that is configured in accordance with one or more embodiments of the present invention.

FIG. 1 provides an example of how a motherboard 100 could be configured in accordance with one or more embodiments of the present invention. As shown, motherboard 100 includes an embedded controller 101 and a number of connectors 102-1 through 102-n (generally or collectively "connector(s) 102"). For purposes of this description and the claims, the term "monitored connector" may be used to reference a connector for which embedded controller 101 provides the functionality described herein. In some embodiments, a motherboard may include both monitored connectors (e.g., any connector that is susceptible to corrosion) and unmonitored connectors (e.g., any connector that is not susceptible to corrosion).

Each connector 102 can be configured to receive a device having a corresponding connector. Accordingly, FIG. 1 shows devices 110-1 through 110-n (generally or collectively "device(s) 110") connected to connectors 102. Motherboard 100 can be configured to electrically connect a number of pins (e.g., Pin#1-Pin#n) of embedded controller 101 to a pin of each connector 102. For purposes of this description and the claims, the term "monitoring pin" may be used to reference a pin of embedded controller 101 that is connected to a "monitored pin" of a connector 102 for purposes of implementing the functionality described herein. Each monitoring pin and monitored pin pair can be connected to the real-time clock (RTC) power rail via a resistor. As represented in FIG. 1, the monitored pin of a particular connector 102 can be selected to ensure that the monitored pin is grounded when a device 110 is connected. Accordingly, when a device 110 is not connected to a connector 102, there will not be a voltage drop across the resistor and the voltage at the monitoring pin will substantially match the voltage of the RTC power rail. In contrast, when a device 100 is connected to a connector 102, there will be a voltage drop across the resistor and the voltage at the monitoring pin will be zero. Notably, the RTC power rail is powered even when the system is powered off (e.g., when the system is in the S5 or G3 state). Embedded controller 101 may therefore detect these voltage changes on the monitoring pins even when the system is not active. Embedded controller 101 may also receive power from the RTC power rail, at least when the system is not powered on.

Figure 1A:
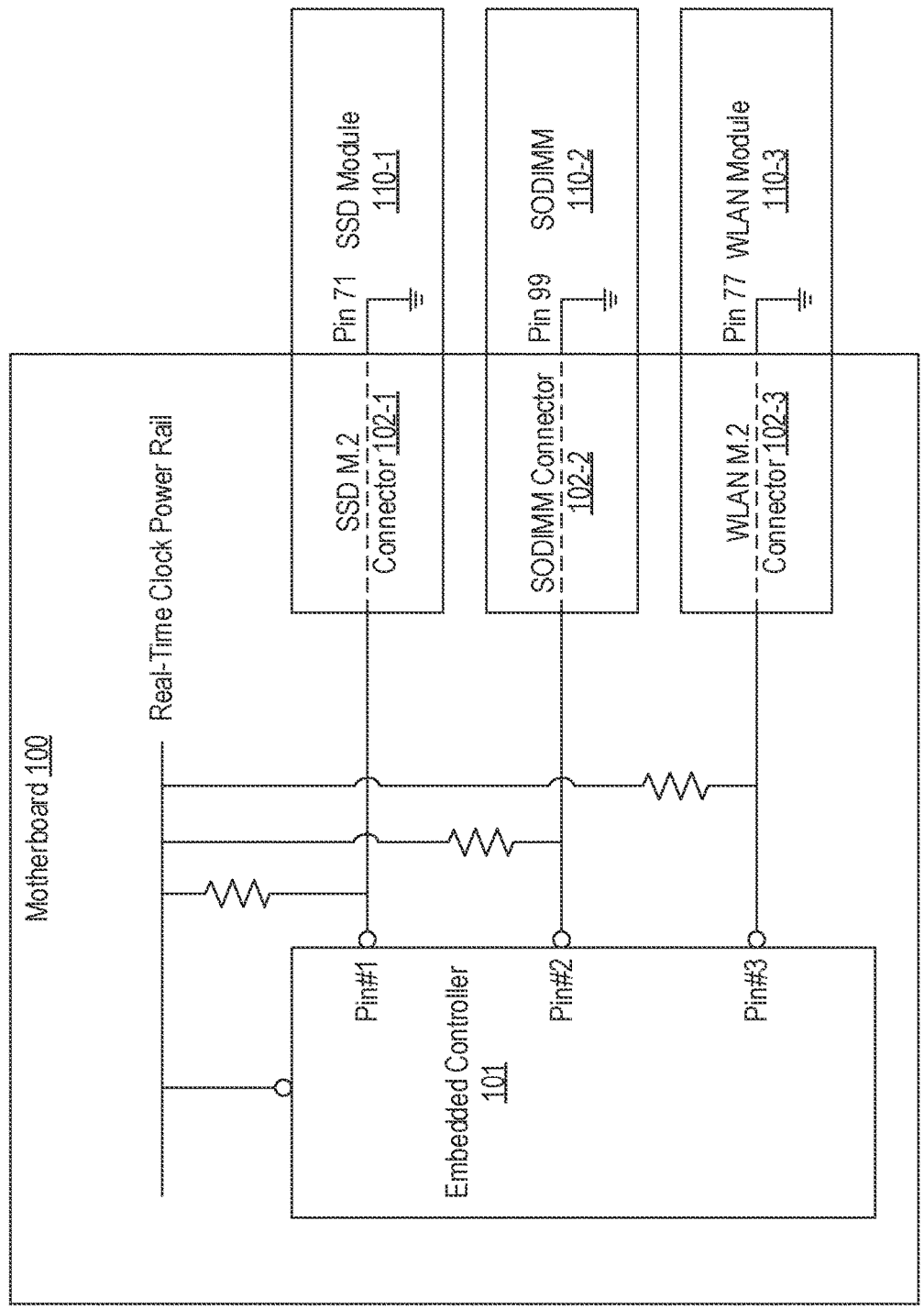
FIG. 1A is another block diagram of a motherboard that is configured in accordance with one or more embodiments of the present invention.

FIG. 1A provides an example based on a common configuration of a laptop. In this example, it is assumed that connectors 102-1 and 102-3 are M.2 connectors intended for SSD modules and WLAN modules respectively and connector 102-2 is a SODIMM connector. It is also assumed that device 110-1 is an SSD module, device 110-2 is a SODIMM and device 110-3 is a WLAN module. Because pin 71 of SSD modules is connected to ground, pin 71 of connector 102-1 can be connected to monitoring pin#1. Similarly, because pin 99 of SODIMM modules and pin 77 of WLAN modules are connected to ground, pins 99 and 77 of connectors 102-2 and 102-3 can be connected to monitoring pin#2 and monitoring pin#3 respectively. Accordingly, with the three devices 110 connected as shown in FIG. 1A, embedded controller 101 can detect the lower voltage at the three monitoring pins to thereby determine that each of the three connectors 102 have devices connected.

Figure 2:
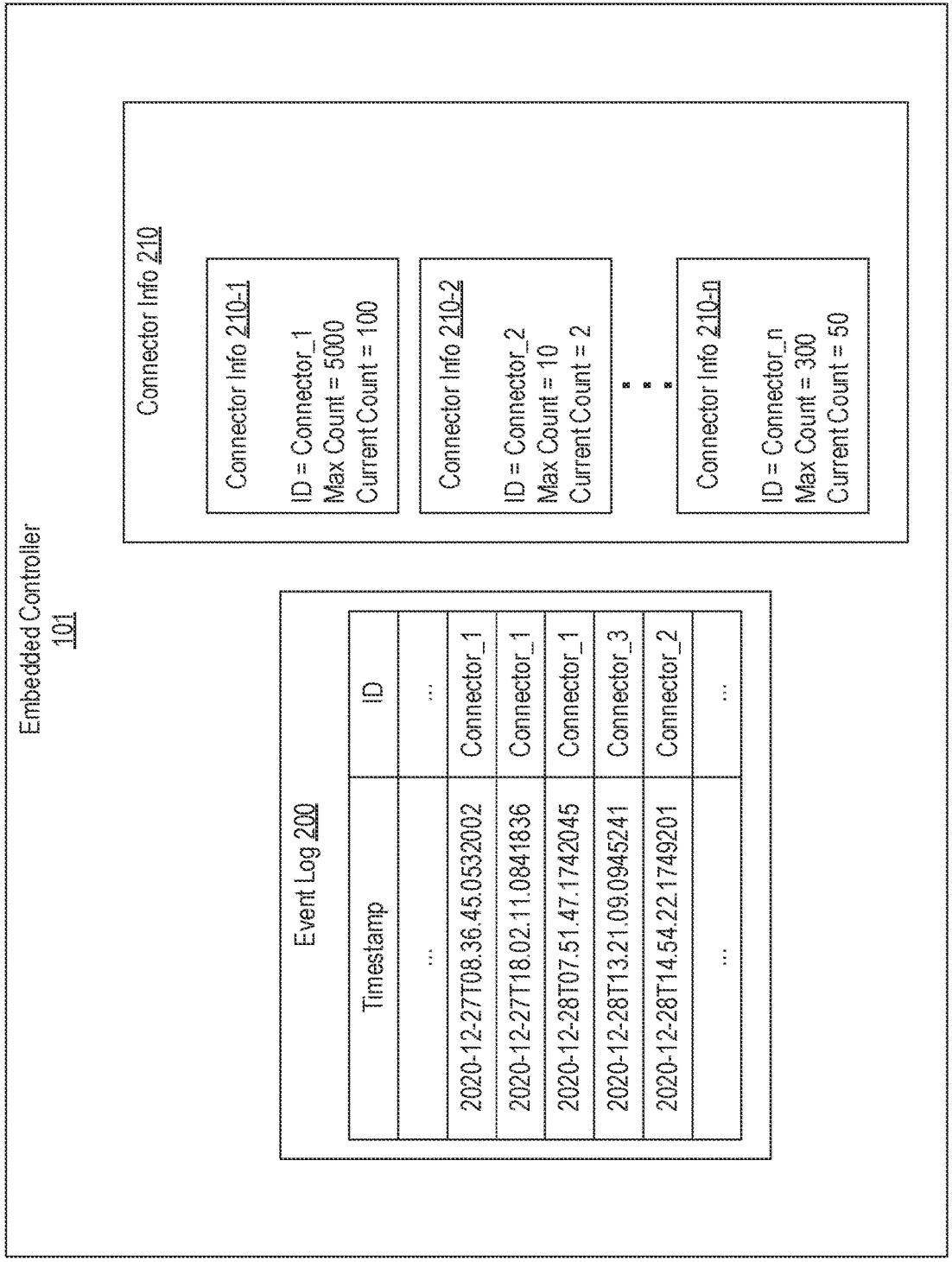
FIG. 2 provides an example of various data structures an embedded controller on a motherboard can maintain in accordance with one or more embodiments of the present invention.

FIG. 2 provides an example of data structures that embedded controller 101 can maintain to track the connection and disconnection of devices 110 to and from connectors 102. Although these data structures are depicted as being maintained in the internal storage of embedded controller 101, they could equally be maintained in any storage that is accessible to embedded controller 101. These data structures include an event log 200 in which embedded controller 101 stores connection/disconnection events (e.g., by associating an identifier of the connector and a timestamp defining when a device was connected to or disconnected from the connector) and connector information data structures 210 in which embedded controller 101 stores information specific to a particular connector 102. For example, connector information data structures 210 can include connector information data structure 210-1 through connector information data structure 210-n for connectors having identifiers of Connector_1 through Connector_n respectively. Connector_1, Connector_2 and Connector_n are assumed to be the identifiers for connectors 102-1, 102-2 and 102-n respectively. Embedded controller 101 can be configured to associate each monitoring pin with the identifier of the corresponding connector 102.

In addition to the connector's identifier, each connector information data structure 210 can also define a maximum count and a current count. The maximum count can be a defined maximum number of connections/disconnections that the connector can experience before corrosion is likely. For example, the maximum count for a particular connector could be determined based on testing, characteristics of the connector (e.g., the thickness of gold plating), intended use, etc. On the other hand, embedded controller 101 can increment the current count each time it detects the connection or disconnection of a device.

Figure 3A:
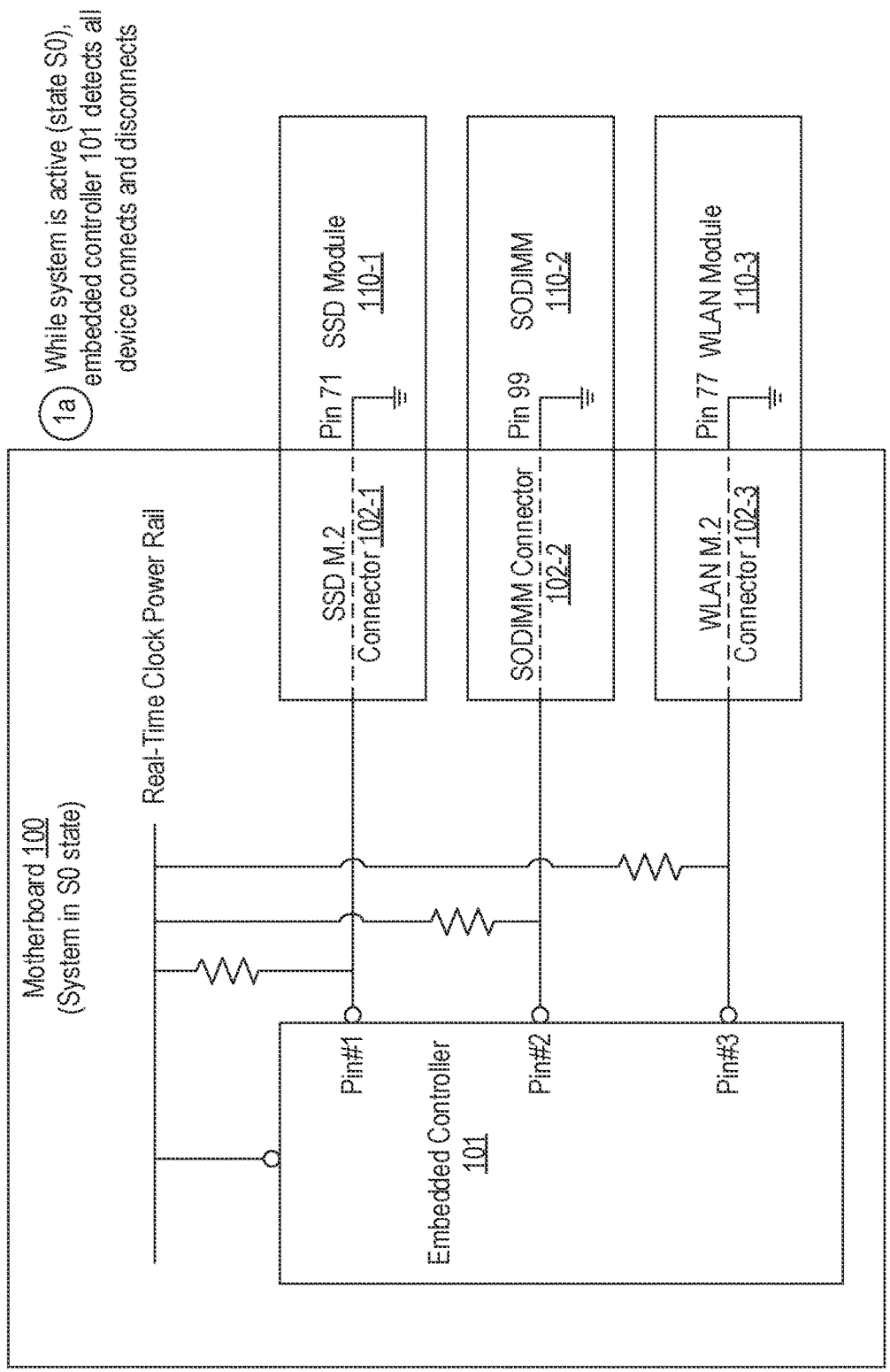
FIGS. 3A-3D represent how the embedded controller can maintain an event log and connector information in response to devices being connected to and disconnected from each monitored connector on the motherboard in accordance with one or more embodiments of the present invention.

FIGS. 3A-3D, which are based on FIG. 1A, provide an example of how embedded controller 101 can detect when a device 110 is connected to or disconnected from any of connectors 102 (i.e., any monitored connector) even when the system is powered off. In FIG. 3A, it is assumed that the system is in an active state (e.g., the S0 state) and that devices 110-1 through 110-3 are connected to connectors 102-1 through 102-3 respectively. With the system in the active state, embedded controller 101 can be fully functional and can therefore actively detect whenever the voltage at a monitoring pin changes as represented by step 1a. For example, if device 110-3 were disconnected from connector 102-3 while the system is in the s0 state, embedded controller 101 would actively detect the voltage increase at pin#3 that would result due to pin#3 no longer being grounded through device 110-3 and determine that connector 102-3 no longer has a device connected to it. In response, embedded controller 101 could update event log 200 and connector information data structures 210 as described below. Embedded controller 101 could perform a similar detection if a device 110 were connected to a connector 102 when the system is active.

As represented in step 1b, and to enable embedded controller 101 to detect when a device 110 is connected or disconnected while the system is not active, embedded controller 101 can configure a wake event for each monitoring pin (which may be GPIO pins) where the wake event is based on the current state of the monitoring pin. In particular, if the voltage at a monitoring pin is currently zero (which would be the case if a device 110 is connected), embedded controller 101 can configure a wake event to be triggered if a high voltage is detected at the monitoring pin. In contrast, if the voltage at the monitoring pin currently matches the RTC power rail voltage (which would be the case if a device 110 is not connected), embedded controller 101 can configure a wake event to be triggered if a low voltage is detected at the monitoring pin. Therefore, based on the assumptions in the depicted example, in step 1b embedded controller 101 could configure the system to be awakened if a high voltage appears on any of the monitoring pins.

Figure 3B:
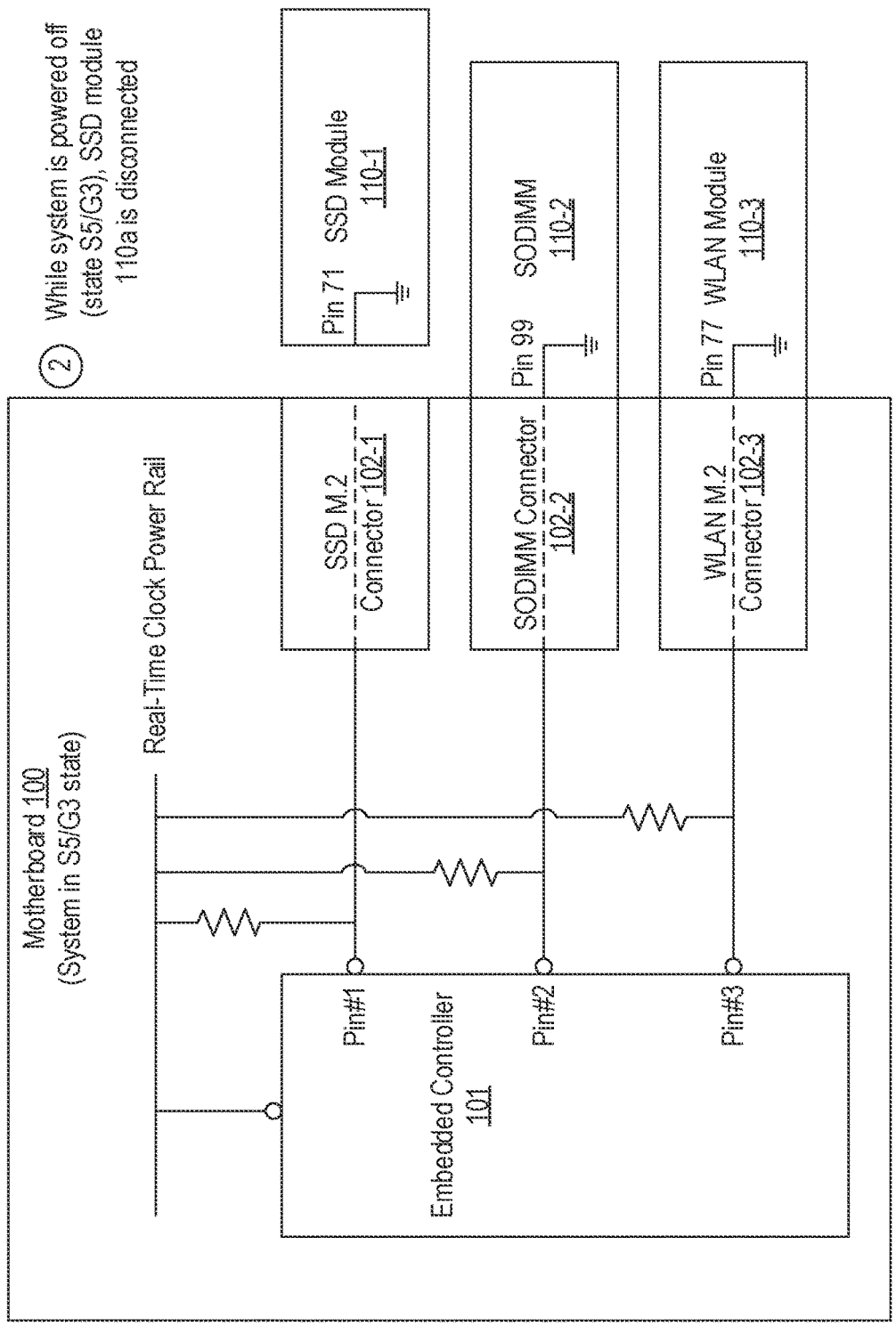
Figure 3C:
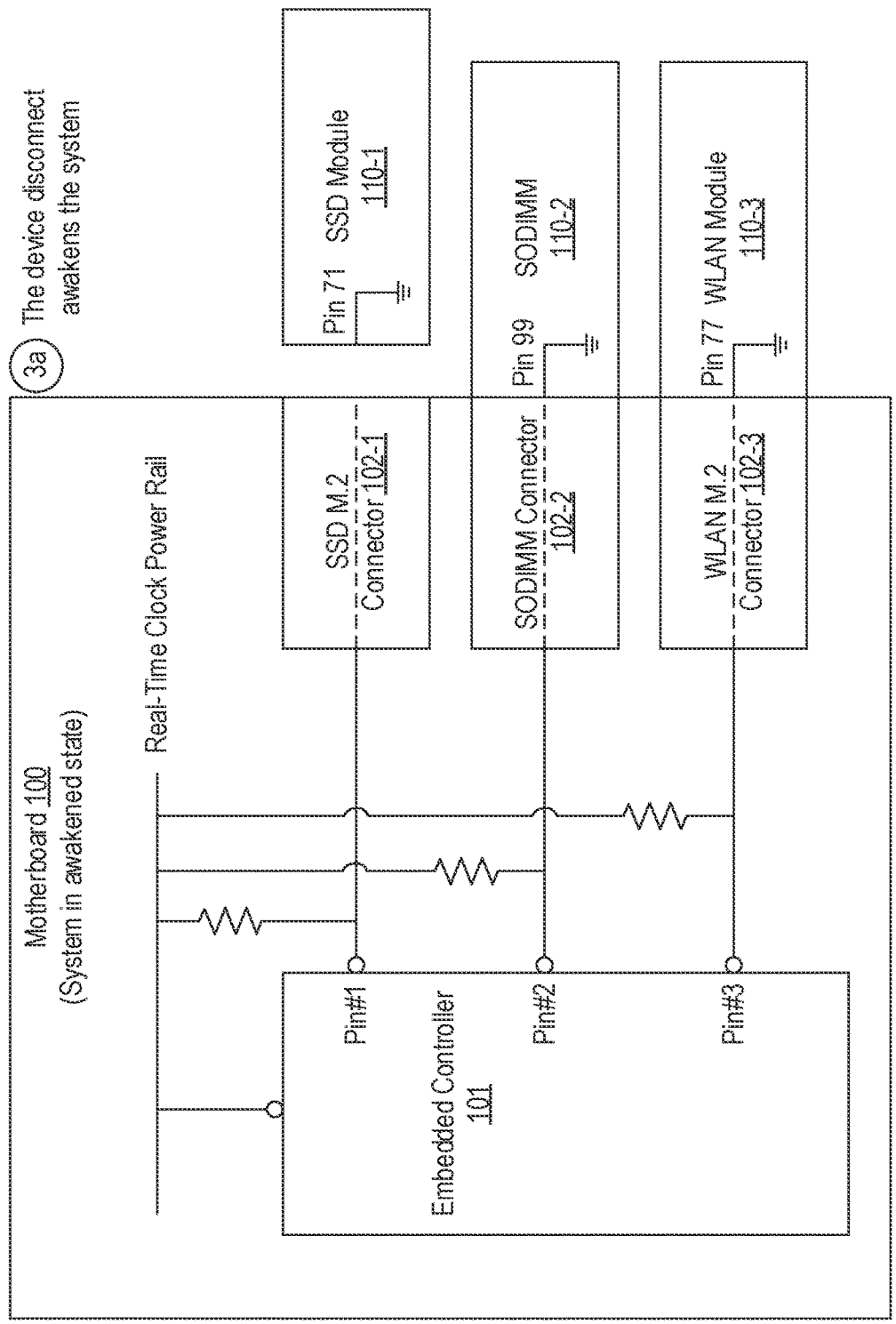

Turning to FIG. 3B, it is assumed that the system is powered off while devices 110-1 through 110-3 are still connected to connectors 102-1 through 102-3 respectively. Then, in step 2, it is assumed that the end user removes device 110-1 from connector 102-1 while the system is powered off (e.g., in the S5/G3 state). As described above, because the RTC power rail remains powered even in the S5/G3 state, the removal of device 110-1 will cause a high voltage to appear at pin#1 of embedded controller 101. Turning to FIG. 3C, in step 3a and due to the wake event that embedded controller 101 previously configured, the high voltage at pin#1 will cause the system to awaken. In step 3b, embedded controller 101 can detect the high voltage at pin#1 and therefore determine that connector 102-1 no longer has a device connected to it. In other words, embedded controller 101 can determine that the system was awakened by the disconnection of a device from a monitored connector.

Figure 3D:
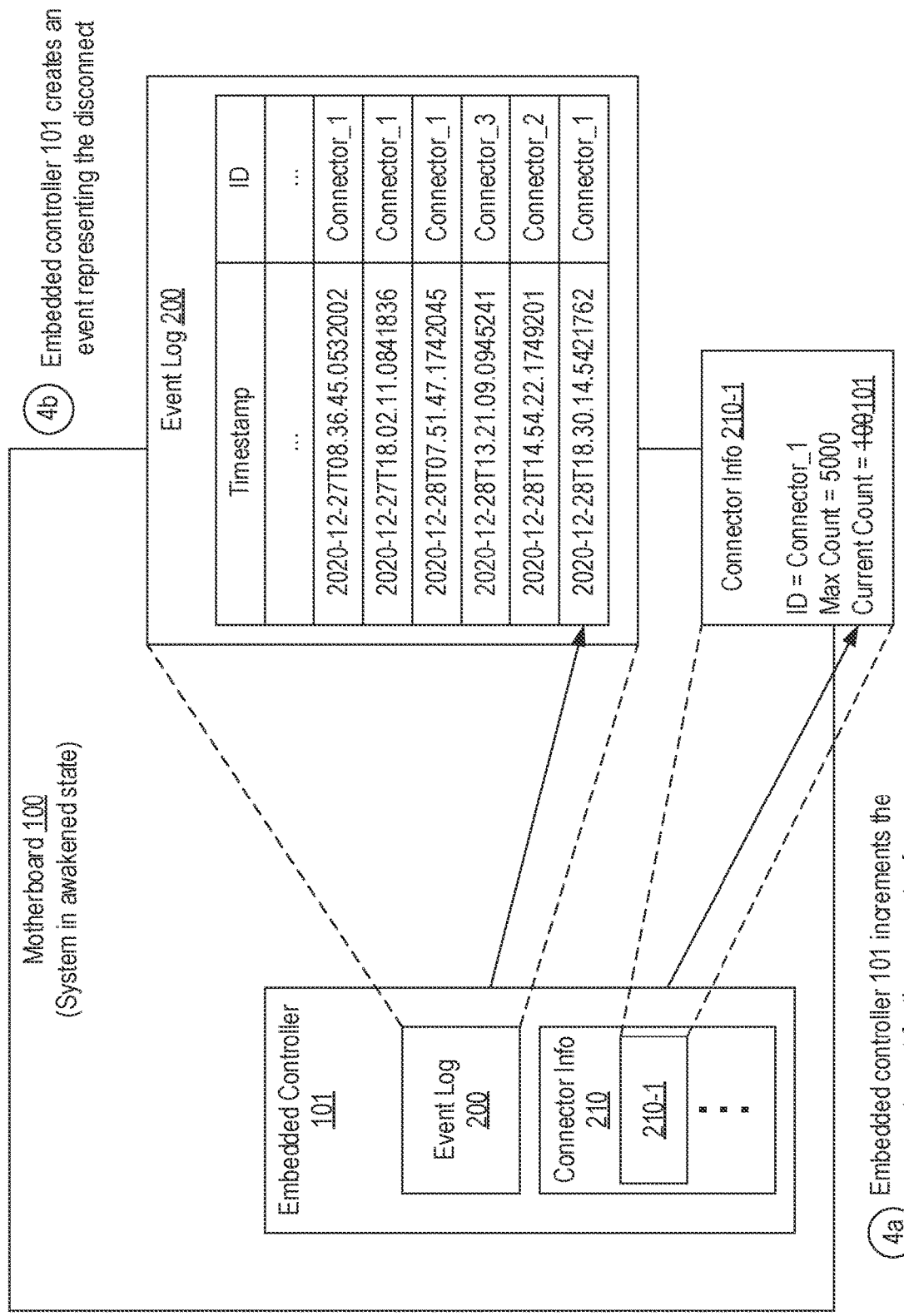

Turning to FIG. 3D, in response to determining that device 110-1 was disconnected from connector 102-1 (or more particularly, in response to determining that pin#1 transitioned from a low voltage to a high voltage), in step 4a embedded controller 101 can increment the current count of the appropriate connector information data structure. In this case, because the change in voltage occurred at pin#1, embedded controller 101 can access connector information data structure 210-1 and increment the current count defined therein from 100 to 101. Also, in step 4b, embedded controller 101 can update event log 200 to include an entry representing the disconnection of device 110-1 from connector 102-1. This may entail obtaining the connector identifier from connector information data structure 210-1 and a current timestamp and writing them to a new entry in event log 200. Accordingly, at this point, any other component could access connector information data structure 210-1 to determine that a device has been connected to or disconnected from connector 102-1 101 times and could access event log 200 to determine that a device was last connected to or disconnected from connector 102-1 at 6:30 PM on Dec. 28, 2020.

Embedded controller 101 can perform similar functionality when a device is connected while the system is powered off. In particular, in step 1b, for a monitoring pin for which a device is not connected, embedded controller 101 could configure a wake event that is triggered when the voltage on the monitoring pin transitions from high to low. Then, when a device is connected and the system is awakened in step 3a, embedded controller 101 could detect the connection in step 3b and update connector information data structure 210 and event log 200 in steps 4a and 4b. Likewise, embedded controller 101 can perform this functionality when a device is connected or disconnected when the system is powered on. In such cases, embedded controller 101 could perform steps 4a and 4b upon detecting a voltage transition at any monitoring pin. In short, embedded controller 101 can detect and track each connection or disconnection regardless of the system's power state.

Figure 4:
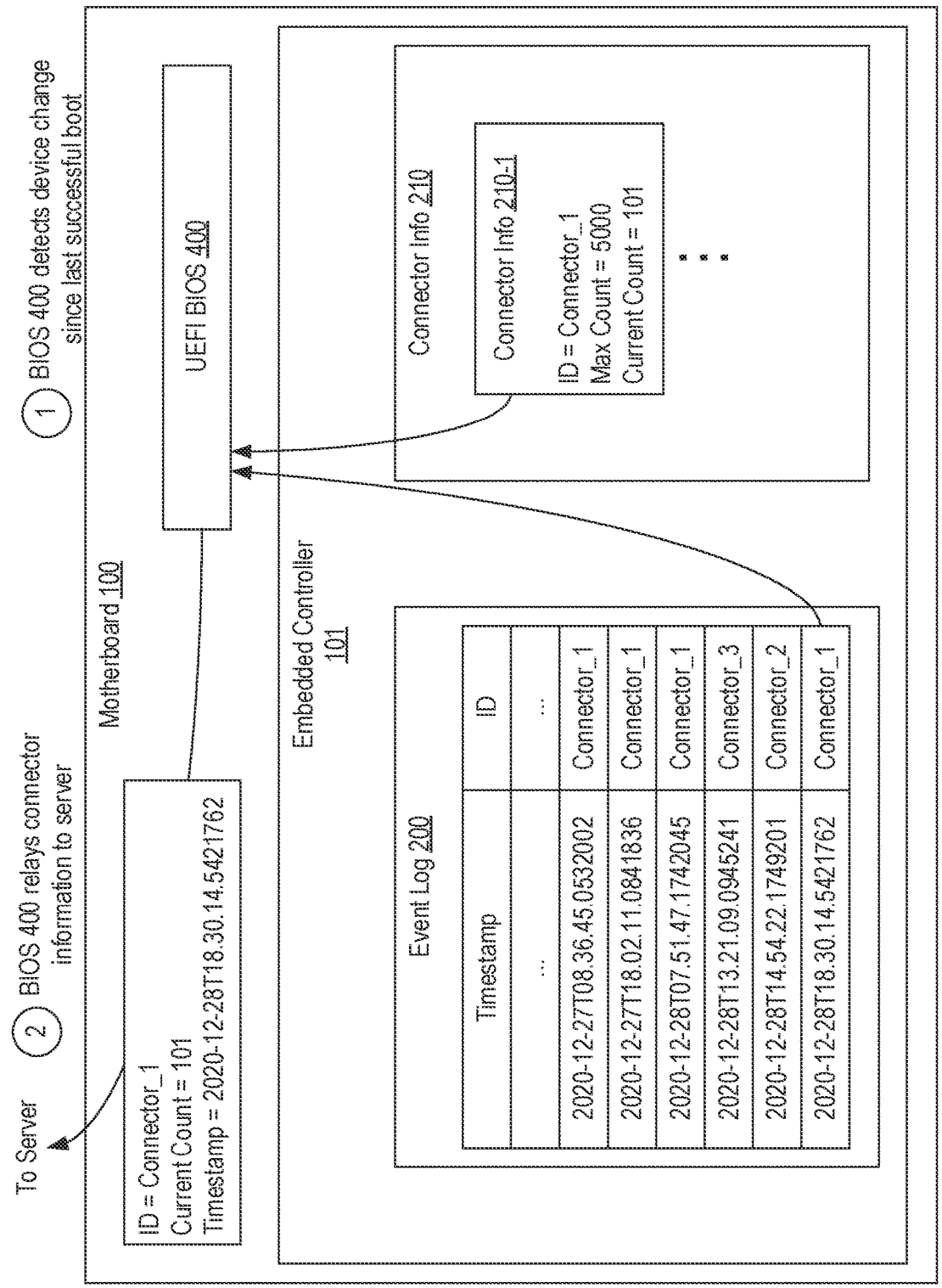
FIG. 4 represents how system BIOS can leverage the event log and the connector information to notify a server when a device has been connected to or disconnected from a monitored connector in accordance with one or more embodiments of the present invention.

FIG. 4 provides an example of how event log 200 and connector information data structures 210 could be leveraged by another component on the system. In this example, it is assumed that system (UEFI) BIOS 400 is performing a boot sequence on motherboard 100 at some time after the process depicted in FIGS. 3A-3D and before a device has again been connected to connector 102-1. For example, FIG. 4 could represent the next time the system is booted.

In step 1 of FIG. 4, BIOS 400 can access event log 200 to determine that there has been a device change since the last successful boot. For example, BIOS 400 can maintain an indication (not shown) of when the last successful boot occurred and can compare this indication to the entries in event log 200. Step 1 may therefore entail determining that a device has been disconnected from the connector having an identifier of Connector_1 since the last successful boot.

In step 2, and in response to detecting the device change, BIOS 400 can use the connector identifier obtained from event log 200 to retrieve the connector information from the corresponding connector information data structure and then send the connector information to a server. In this example, this may entail using Connector_1 to retrieve and read connection information data structure 210-1 and then sending a network communication that includes the connector identifier (Connector_1), the current count (101) and the timestamp of the last connection/disconnection (2020-12-28T18.30.14.5421762).

Figure 5:
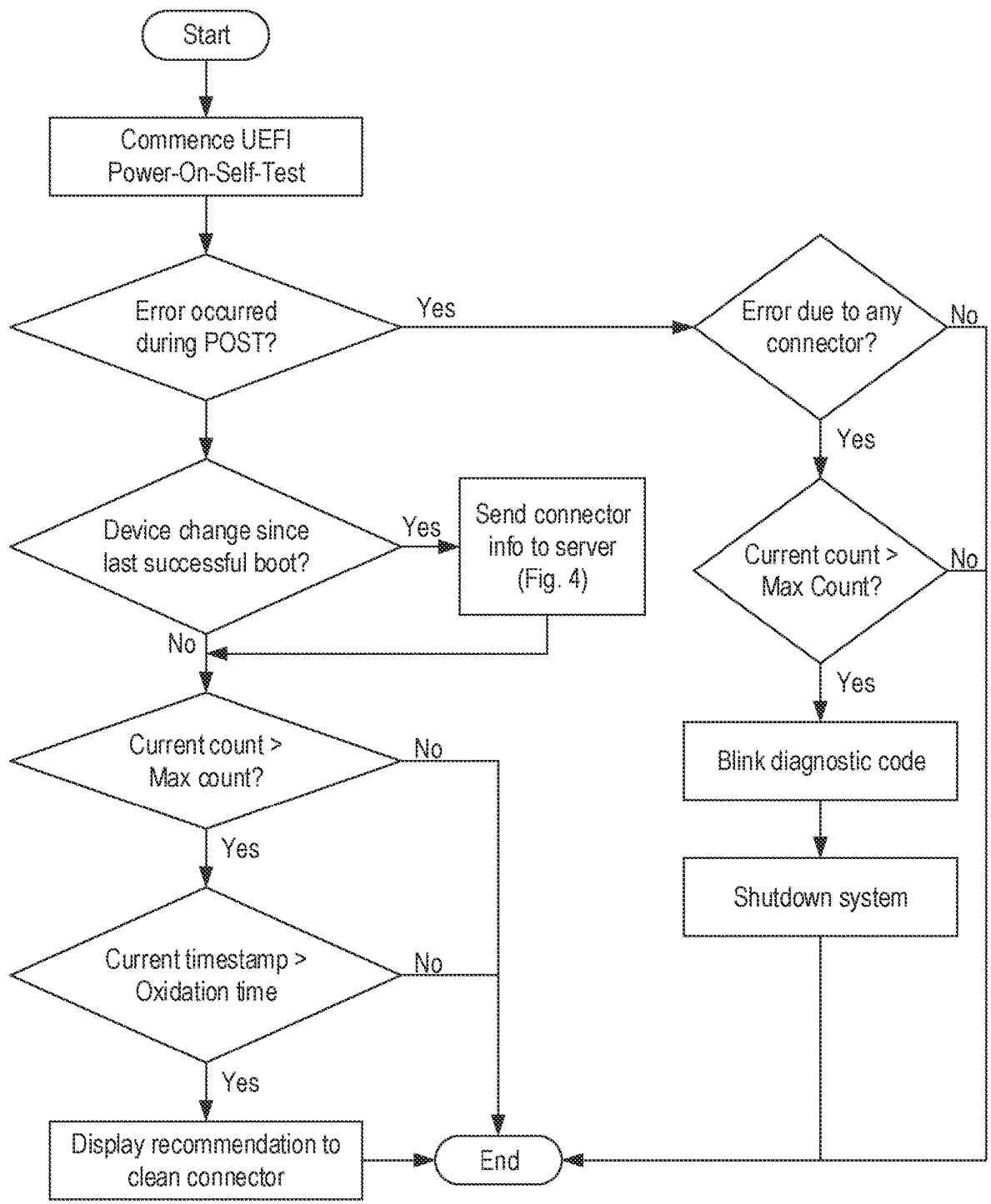
FIG. 5 provides a flow diagram representing functionality that system BIOS can perform using the event log and connector information in accordance with one or more embodiments of the present invention.

FIG. 5 provides a flow diagram of an example process that can be performed as part of the UEFI boot process (e.g., as part of POST) leveraging event log 200 and connector information data structures 210. During POST, the BIOS can detect whether an error has occurred. If so, the BIOS can determine whether the error was due to any monitored connector. If so, the BIOS can access connector information data structures 210 to obtain the current count and maximum count for the monitored connector that caused the error. If the current count exceeds the maximum count, the BIOS can cause a diagnostic code to be presented to the end user (e.g., by blinking an LED with a particular pattern) to thereby inform the end user that the monitored connector should be cleaned to remove any corrosion. The BIOS may then shutdown the system.

On the other hand, if there is no error during POST, the BIOS can determine if there have been any device changes since the last successful boot (e.g., by accessing event log 200), and if so, can send the corresponding connector information to a server as represented in FIG. 4. The BIOS can also access connector information data structures 210 to determine if the current count for any monitored connector exceeds the maximum count. If so, the BIOS may determine whether the amount of time since the last connect/disconnect for the monitored connector exceeds the amount of time for oxidation to occur, and if so, display a recommendation to clean the monitored connector. For example, if the current count in connector information data structure 210-2 reached 11, the BIOS may not immediately recommend cleaning connector 110-2 (because the successful completion of POST would suggest that the connector is not corroded) but may wait until enough time has passed that corrosion has become likely. This "oxidation time" could be one month or any other suitable period. By accessing event log 200 to obtain the timestamp of the last device change for the monitored connector, the BIOS can calculate whether the amount of time that has lapsed since the "current timestamp" is greater than the oxidation time. In this way, the BIOS can leverage the data structures maintained by embedded controller 101 to assist the end user in prolonging the life of the monitored connectors or determining when they or the motherboard should be replaced.

In some embodiments, in addition to or in place of the above-described techniques that predict connector failures by counting device connects and disconnects, the CPU/BIOS of the computer (or any other suitable component on motherboard 100 including possibly embedded controller 101) may predict connector failures by tracking device training attributes. In particular, the BIOS can be configured to calculate baseline training attributes for each monitored connector as well as periodic training attributes over the life of each monitored connector. The BIOS can compare the periodic training attributes to the baseline training attributes to predict when the monitored connector is likely to fail.

Figure 6:
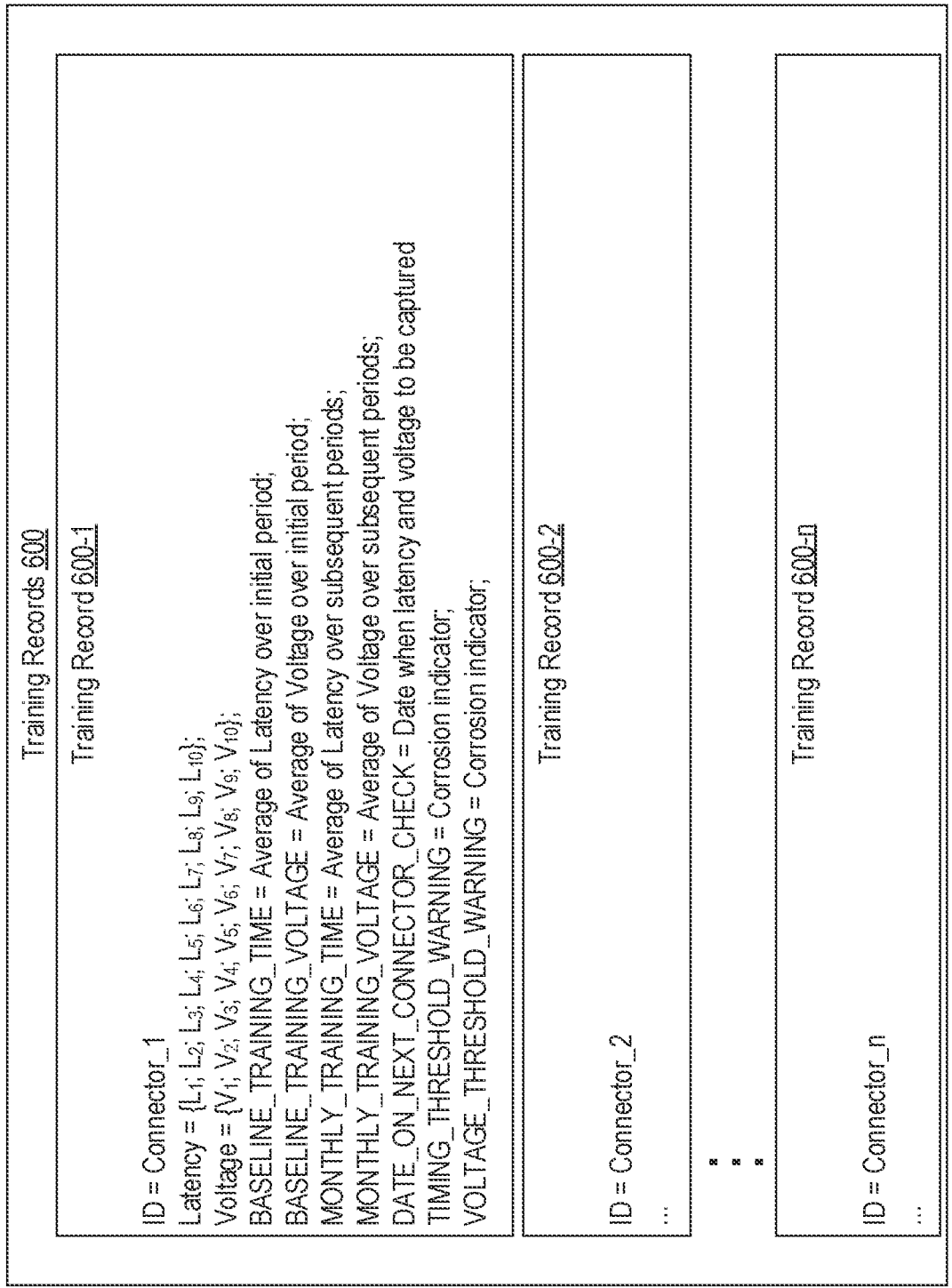
FIG. 6 provides an example of a training records data structure that the embedded controller can maintain in accordance with one or more embodiments of the present invention.

FIG. 6 provides an example of a training records data structure 600 that the BIOS may maintain to facilitate connector failure predictions based on device training attributes. The BIOS may maintain a training record data structure 600-1 through 600-$n$ for each connector 102-1 through 102-$n$ respectively. Each training record data structure 600 can include the identifier of the corresponding monitored connector, a latency array for storing latency (or "training time") measurements, a voltage (or gain) array for storing "training voltage" measurements and other values that are described below.

As part of initializing a device 110, the device may be trained to determine its proper operational characteristics. The duration of time that it takes to complete the training will be referred to as the "training time." The trainer (e.g., a component of the BIOS) may employ a "training voltage" during the training process as is known to those of skill in the art. As a monitored connector becomes corroded, the training time and training voltage should increase.

As an overview, embodiments of the present invention can predict connector failure based on device training characteristics by measuring training time and training voltage during an initial number boots of the system. For example, during the first ten boots of the system, the training time and training voltage can be stored. The average of these attributes can then be maintained as baselines. After some period of time, the training time and training voltage can again be measured over a number of boots. These subsequently measured attributes can then be compared to the baseline to determine if corrosion has occurred. If the comparison suggests that corrosion has occurred, the end user can be prompted to take preventive or corrective action.

Figure 7A:
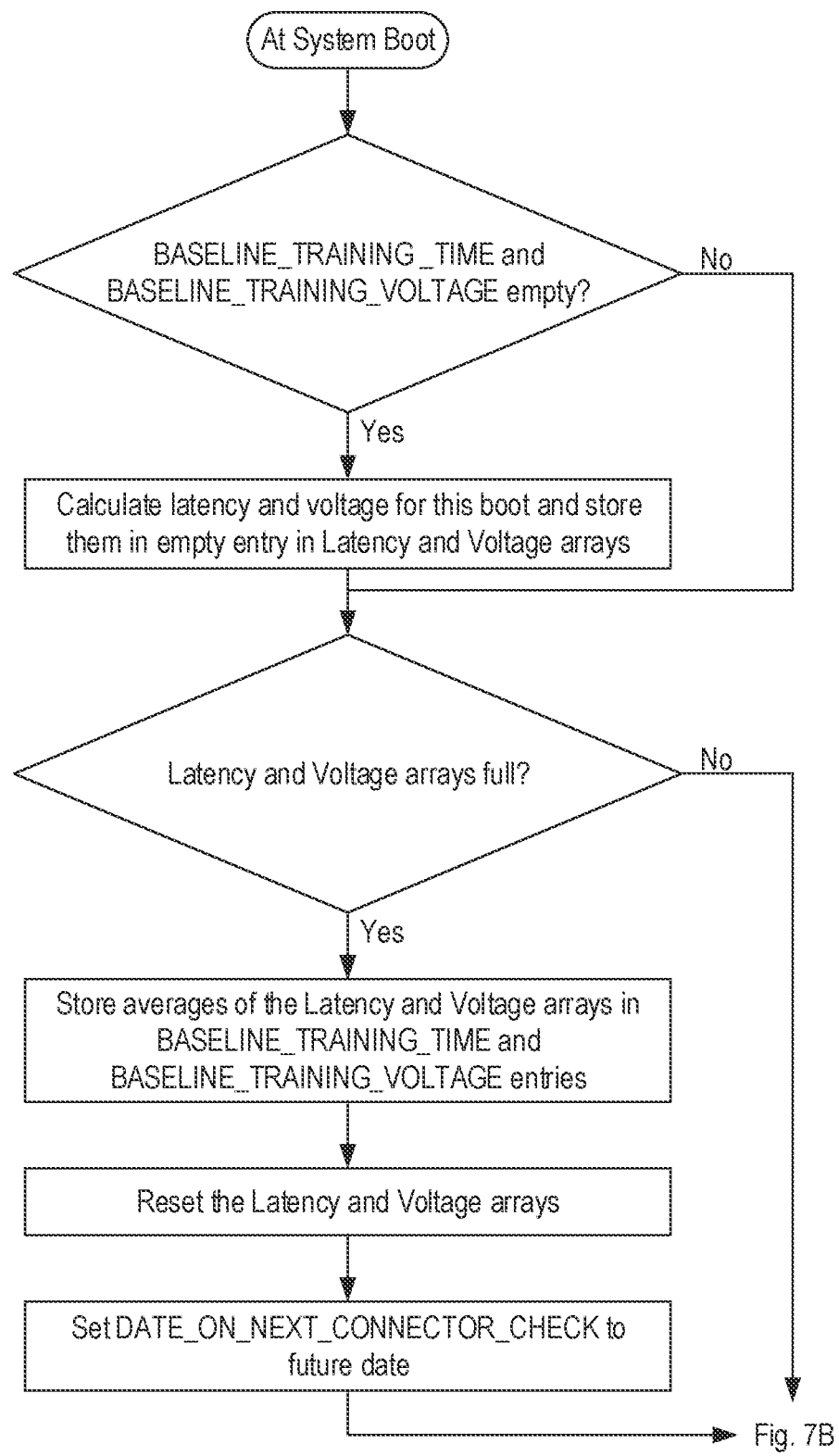
FIGS. 7A-7C provide a flow diagram representing functionality that the embedded controller can perform to create and evaluate training records to detect whether and to what extent a monitored connector is corroded.
Figure 7B:
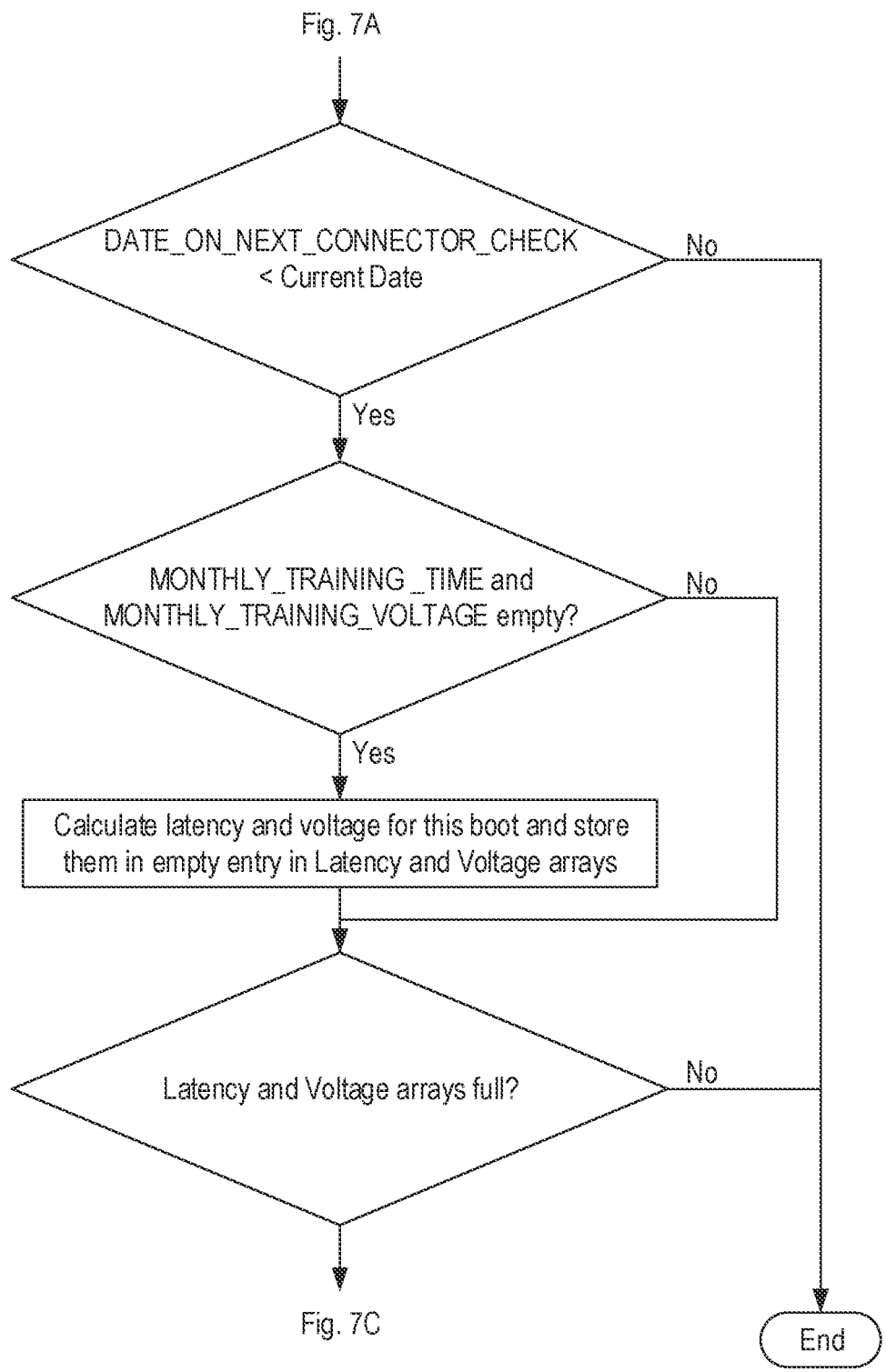
Figure 7C:
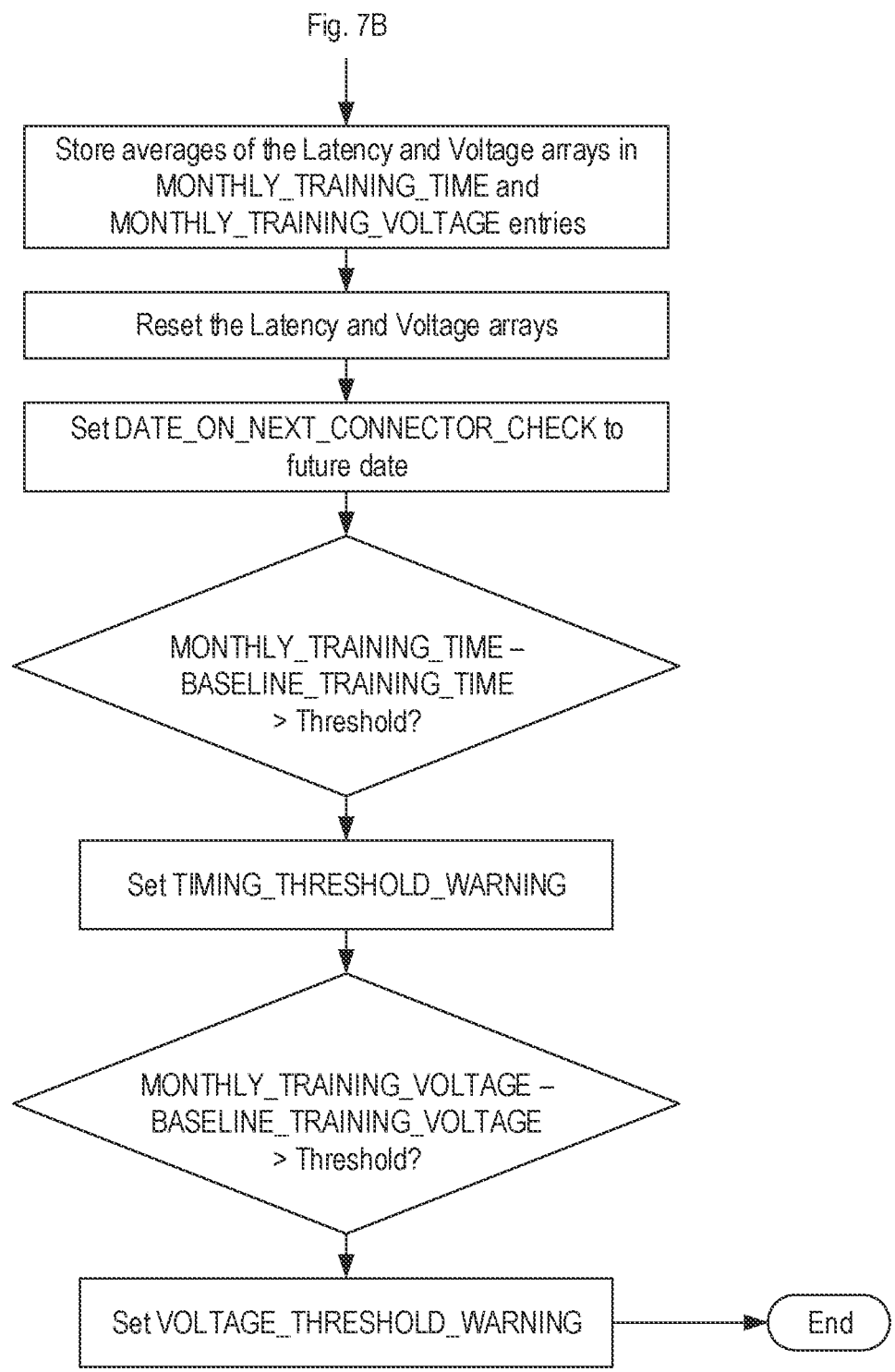

FIGS. 7A-7C provide a flow diagram representing functionality that can be performed during the boot process to predict connector failure based on device training attributes. When a system is manufactured, the parameters (other than the ID and the two warning parameters) in each training record data structure 600-1 through 600-$n$ can be reset. Then, when the system is booted, it can be determined (e.g., by the BIOS, embedded controller 101 or any other suitable component on motherboard 100) whether the BASELINE_TRAINING_TIME and BASELINE_TRAINING_VOLTAGE parameters in any training record data structure 600-1 through 600-$n$ is not set. As will become apparent, this would be the case until the system has been booted a sufficient number of times to cause the latency and voltage arrays to be filled. Accordingly, when the system is first booted, the training time and training voltage will be calculated for that boot and stored in the first empty entry in the latency and voltage arrays. Assuming these arrays have ten entries, this same process will be performed during the first ten boots.

Once the latency and voltage arrays are filled for the first time, the average of the training times stored in the latency array can be stored in the BASELINE_TRAINING_TIME parameter and the average of the training voltages stored in the voltage array can be stored in the BASELINE_TRAINING_VOLTAGE parameter. The latency and voltage arrays can then be cleared and the DATE_ON_NEXT_CONNECTOR_CHECK parameter can be set to a future date (e.g., one month in the future). Assuming again that the arrays have ten entries, these baselines would be defined after ten boots.

During subsequent boots, it will be determined if the current date has reached the date specified in DATE_ON_NEXT_CONNECTOR_CHECK. If so, and if the MONTHLY_TRAINING_TIME and MONTHLY_TRAINING_VOLTAGE parameters are not set, the training time and training voltage can be measured for the current boot and stored in the latency and voltage arrays. This process will be repeated until the latency and voltage arrays are again filled. Once the latency and voltage arrays have again been filled, the average of the training times stored in the latency array can be stored in the MONTHLY_TRAINING_TIME parameter and the average of the training voltages stored in the voltage array can be stored in the MONTHLY_TRAINING_VOLTAGE parameter. The latency and voltage arrays can then be cleared and the DATE_ON_NEXT_CONNECTOR_CHECK parameter can be set to a future date (e.g., one month in the future). Assuming again that the arrays have ten entries, these periodic averages would be defined after ten boots.

With the MONTHLY_TRAINING_TIME parameter set, it can be determined whether the difference between the MONTHLY_TRAINING_TIME and the BASELINE_TRAINING_TIME is greater than a defined threshold. In other words, it can be determined if the current training time has slowed by more than the defined threshold. If so, the TIMING_THRESHOLD_WARNING can be set. Similarly, with the MONTHLY_TRAINING_VOLTAGE parameter set, it can be determined whether the difference between the MONTHLY_TRAINING_VOLTAGE and the BASELINE_TRAINING_VOLTAGE is greater than a defined threshold. In other words, it can be determined if the current training voltage has increased by more than the defined threshold. If so, the VOLTAGE_THRESHOLD_WARNING can be set. This process of calculating the average training time and average training voltage and comparing them to the baselines can be performed periodically (e.g., monthly) to thereby enable the BIOS, the operating system or other runtime component to determine when the end user should be notified. For example, the BIOS could be configured to read the TIMING_THRESHOLD_WARNING and VOLTAGE_THRESHOLD_WARNING parameters and, when either is set, generate a notification or recommendation in a similar manner as represented in FIGS. 4 and 5. In some embodiments, these defined thresholds could be determined by testing connectors in an environmental chamber using worst case scenarios (e.g., minimum and maximum temperature environments).

In some embodiments, the BIOS may provide an option for a technician to immediately initiate the periodic process for determining the training attributes after cleaning a monitored connector. For example, the BIOS could allow the technician to reset the latency and voltage arrays and the periodic averages and also set the DATE_ON_NEXT_CONNECTOR_CHECK to the current time to thereby cause the training attributes to be measured during the next ten boots. This can enable the technician to quickly identify whether the cleaning has removed the corrosion from the monitored connector.

In addition to predicting connector failure to assist the end user in taking corrective or preventive action, embodiments of the present invention can also enable the manufacturer to better determine how robust a connector should be for a particular use case. For example, by counting connection cycles and/or monitoring training attributes, embodiments of the present invention could be leveraged to determine that thicker or thinner gold plating could be used on a particular connector type or for a particular type of end user.

Embodiments of the present invention may comprise or utilize special purpose or general-purpose computers including computer hardware, such as, for example, one or more processors and system memory. Embodiments within the scope of the present invention also include physical and other computer-readable media for carrying or storing computer-executable instructions and/or data structures. Such computer-readable media can be any available media that can be accessed by a general purpose or special purpose computer system.

Computer-readable media are categorized into two disjoint categories: computer storage media and transmission media. Computer storage media (devices) include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other similar storage medium which can be used to store desired program code means in the form of computer-executable instructions or data structures and which can be accessed by a general purpose or special purpose computer. Transmission media include signals and carrier waves. Because computer storage media and transmission media are disjoint categories, computer storage media does not include signals or carrier waves.

Computer-executable instructions comprise, for example, instructions and data which, when executed by a processor, cause a general-purpose computer, special purpose computer, or special purpose processing device to perform a certain function or group of functions. The computer executable instructions may be, for example, binaries, intermediate format instructions such as assembly language or P-Code, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, smart watches, pagers, routers, switches, and the like.

The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices. An example of a distributed system environment is a cloud of networked servers or server resources. Accordingly, the present invention can be hosted in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A method, performed by an embedded controller a of a motherboard that includes a plurality of monitored connectors, for predicting motherboard connector failures comprising:
    detecting, by the embedded controller, when a device is connected to or disconnected from each of the monitored connectors, wherein the embedded controller includes a plurality of monitoring pins that are each connected to a real-time clock power rail of the motherboard via a resistor, each of the plurality of monitoring pins being connected to a monitored pin of the respective monitored connector, and wherein each monitored in is configured to connect to ground when a device is connected to the respective monitored connector;
    each time it is detected that a device is connected to or disconnected from one of the monitored connectors, incrementing a count;
    comparing the count to a maximum count for the respective monitored connector; and
    when the count exceeds the maximum count, notifying an end user.

2. The method of claim 1, wherein detecting when a device is connected to or disconnected from one of the monitored connectors comprises detecting a voltage change at the respective monitoring pin.

3. The method of claim 2, further comprising:
    configuring a wake event for the respective monitoring pin while a system is active; and wherein detecting the voltage change at the respective monitoring pin comprises determining that the wake event occurred.

4. The method of claim 1, further comprising:
maintaining an event log that identifies each time a device is connected to or disconnected from each of the monitored connectors.

5. The method of claim 1, wherein notifying the end user comprises notifying the end user after determining that an amount of time that has elapsed since the count exceeded the maximum count is greater than an oxidation time.

6. The method of claim 1, wherein notifying the end user comprises presenting a recommendation during a boot process.

7. The method of claim 1, wherein notifying the end user comprises blinking a diagnostic code.

8. The method of claim 1, further comprising:
determining one or more baseline device training attributes for each of the monitored connectors;
determining one or more periodic device training attributes for each of the monitored connectors; and
when a first periodic device training attribute of the one or more periodic device training attributes exceeds a corresponding first baseline device training attribute of the one or more baseline device training attributes by a defined threshold, notifying the end user.

9. The method of claim 8, wherein the first periodic device training attribute is a device training time or a device training voltage.

10. The method of claim 8, wherein the first periodic device training attribute is an average device training time or an average device training voltage.

11. The method of claim 1, further comprising:
during each of an initial set of boots, calculating and storing a training time and a training voltage for each of the monitored connectors;
calculating a baseline training time from the training times stored during the initial set of boots and a baseline training voltage from the training voltages stored during the initial set of boots;
during each of a subsequent set of boots; calculating and storing a training time and a training voltage for each of the monitored connectors;
calculating a periodic training time from the training times stored during the subsequent set of boots and a periodic training voltage from the training voltages stored during the subsequent set of boots;
comparing the periodic training time to the baseline training time and the periodic training voltage to the baseline training voltage; and
when either the periodic training time exceeds the baseline training time by a defined threshold or the periodic training voltage exceeds the baselines training voltage by a defined threshold, notifying the end user.

12. The method of claim 11, wherein the subsequent set of boots occur after a defined period of time from the first set of boots.

13. The method of claim 11, wherein the periodic training time is an average of the training times stored during the subsequent set of boots and the periodic training voltage is an average of the training voltages stored during the subsequent set of boots.

14. The method of claim 11, wherein notifying the end user when either the periodic training time exceeds the baseline training time by the defined threshold or the periodic training voltage exceeds the baselines training voltage by the defined threshold comprises presenting a recommendation during a boot process, blinking a diagnostic code or sending a communication to a server.

15. A motherboard comprising:
a plurality of monitored connectors; and
an embedded controller having a plurality of monitoring pins that are each connected to a real-time clock power rail of the motherboard via a resistor, each of the plurality of monitoring pins being connected to a monitored pin of one of the monitored connectors, and wherein each monitored pin is configured to connect to ground when a device is connected to the respective monitored connector, the embedded controller being configured to perform a method for predicting a failure of one or more of the monitored connectors, the method comprising:
maintaining a count and a maximum count for each of the monitored connectors;
detecting, at the respective monitored pin, when a device is connected to or disconnected from any of the monitored connectors;
each time it is detected that a device is connected to or disconnected from one of the monitored connectors, incrementing the count for the respective monitored connector; and
in response to determining that the count for the respective monitored connector exceeds the maximum count for the respective monitored connector, notifying an end user.

* * * * *